(12) United States Patent
Masini et al.

(10) Patent No.: US 8,148,794 B2
(45) Date of Patent: Apr. 3, 2012

(54) PHOTODETECTOR IN GERMANIUM ON SILICON

(75) Inventors: Gianlorenzo Masini, Rome (IT); Lorenzo Colace, Rome (IT); Gaetano Assanto, Rome (IT)

(73) Assignee: Google Inc., Mountain View, CA (US)

( * ) Notice: Subject to any disclaimer, the term of this patent is extended or adjusted under 35 U.S.C. 154(b) by 861 days.

(21) Appl. No.: 11/793,238

(22) PCT Filed: Dec. 24, 2004

(86) PCT No.: PCT/EP2004/014714
§ 371 (c)(1),
(2), (4) Date: Jun. 15, 2007

(87) PCT Pub. No.: WO2006/066611
PCT Pub. Date: Jun. 29, 2006

(65) Prior Publication Data
US 2008/0073744 A1    Mar. 27, 2008

(51) Int. Cl.
*H01L 31/0232* (2006.01)
(52) U.S. Cl. ................. 257/432; 257/E31.127
(58) Field of Classification Search ............. 257/233, 257/13, 84, 94, 103, 432, 446, 21, 616; 438/57, 438/69, 97; 385/14, 130–132, 40–41
See application file for complete search history.

(56) References Cited

U.S. PATENT DOCUMENTS

| | | | |
|---|---|---|---|
| 2,385,386 A | 9/1945 | Stoffel | |
| 2,758,183 A | 8/1956 | Canegallo | |
| 4,250,534 A | 2/1981 | Brown et al. | |
| 4,518,219 A * | 5/1985 | Leonberger et al. | 385/132 |
| 5,107,538 A * | 4/1992 | Benton et al. | 385/130 |
| 5,420,043 A * | 5/1995 | Niwa | 438/96 |

(Continued)

FOREIGN PATENT DOCUMENTS

EP    0 287 111 A2    10/1988
(Continued)

OTHER PUBLICATIONS

Traveling-wave Photodetectors for high-power, large-bandwidth applications (IEEE Transactions on Microwave theory and techniques, vol. 43, No. Sep. 1995).*

(Continued)

*Primary Examiner* — Matthew W Such
*Assistant Examiner* — Ali Naraghi
(74) *Attorney, Agent, or Firm* — Honigman Miller Schwartz and Cohn LLP

(57) ABSTRACT

A photodetector structure includes a silicon-based waveguide in which optical signals to be detected travel in a given direction and are confined therein and a germanium layer disposed in contact with a portion of the silicon-based waveguide so that an evanescent tail of the propagating optical signal in the waveguide is coupled into the germanium layer. In addition, the germanium layer includes a mesa having a length along the signal propagating direction and a width in a direction substantially perpendicular to the propagating direction, in which the width of said mesa is smaller than its length. The photodetector also comprises a first and a second metal contacts, the first metallic contact being located on the germanium layer, the said second metallic contact being located on the silicon-based waveguide, the first and second contacts being used to collect electrons generated by light absorption to obtain an output electric signal.

33 Claims, 13 Drawing Sheets

U.S. PATENT DOCUMENTS

| | | | |
|---|---|---|---|
| 6,229,947 B1* | 5/2001 | Vawter et al. | 385/132 |
| 6,376,272 B1* | 4/2002 | Bond et al. | 438/31 |
| 6,828,598 B1* | 12/2004 | Coffa et al. | 257/102 |
| 6,866,946 B2* | 3/2005 | Cao et al. | 428/690 |
| 6,963,118 B2* | 11/2005 | Deliwala et al. | 257/428 |
| 6,991,892 B2 | 1/2006 | Block | |
| 7,345,812 B2* | 3/2008 | Hui et al. | 359/344 |
| 2002/0076187 A1* | 6/2002 | Coult et al. | 385/131 |
| 2003/0035633 A1* | 2/2003 | Agarwal et al. | 385/49 |
| 2004/0188794 A1* | 9/2004 | Gothoskar et al. | 257/459 |
| 2005/0265679 A1* | 12/2005 | Liu et al. | 385/131 |

FOREIGN PATENT DOCUMENTS

| | | |
|---|---|---|
| EP | 0 709 901 A1 | 5/1996 |
| EP | 0 993 053 A1 | 4/2000 |
| EP | 1 089 347 A2 | 4/2001 |
| GB | 790325 | 2/1958 |

OTHER PUBLICATIONS

Naval et al (Optimization of Si1-xGex/Si waveguide photodetectors Operating at Lambda=1.3 um,Journal of lightwave Technology, vol. 14 No. 5, May 1996).*

Masini, G. et al., "Near-Infrared Waveguide Photodetectors Based on Polycrystalline Ge on Silicon-on-Isulator Substrates," Optical Materials, vol. 17, pp. 243-246, (2001).

Jutzi, M. et al., "Ge-on-Si Pin-Photodiodes for Vertical and In-Plane Detection of 1300 to 1580 nm Light," Solid-State Device Research Conference, Proceeding of the 34$^{th}$ European Leuven, pp. 345-348, (2004).

Masini, G. et al., "Polycrystalline Ge Detectors Integrated on SOI Waveguide: Device Modeling and Experimental Results," Proceedings of SPIE, vol. 4293, pp. 132-139, (2001).

Colace, L. et al., "Ge-on-Si Approaches to the Detection of Near-Infrared Light," IEEE Journal of Quantum Electronics, IEEE, vol. 35, No. 12, pp. 1843-1852, (1999).

Jalali, B., "Si-Based Receivers for Optical Data Links," Journal of Lightwave Technology, vol. 12, No. 6, pp. 930-935, (1994).

Masini, G. et al., "Monolithic Integration of Near-Infrared Ge Photodetectors with Si Complementary Metal-Oxide-Semiconductor Readout Electronics," Applied Physics Letters, vol. 80, No. 18, pp. 3268-3270, (2002).

Masini, G. et al., "2.5 Gbit/s Polycrystalline Germanium-on Silicon Photodetector Operating from 1.3 to 1.55 μm," Applied Physics Letters, vol. 82, No. 15, pp. 2524-2526, (2003).

* cited by examiner

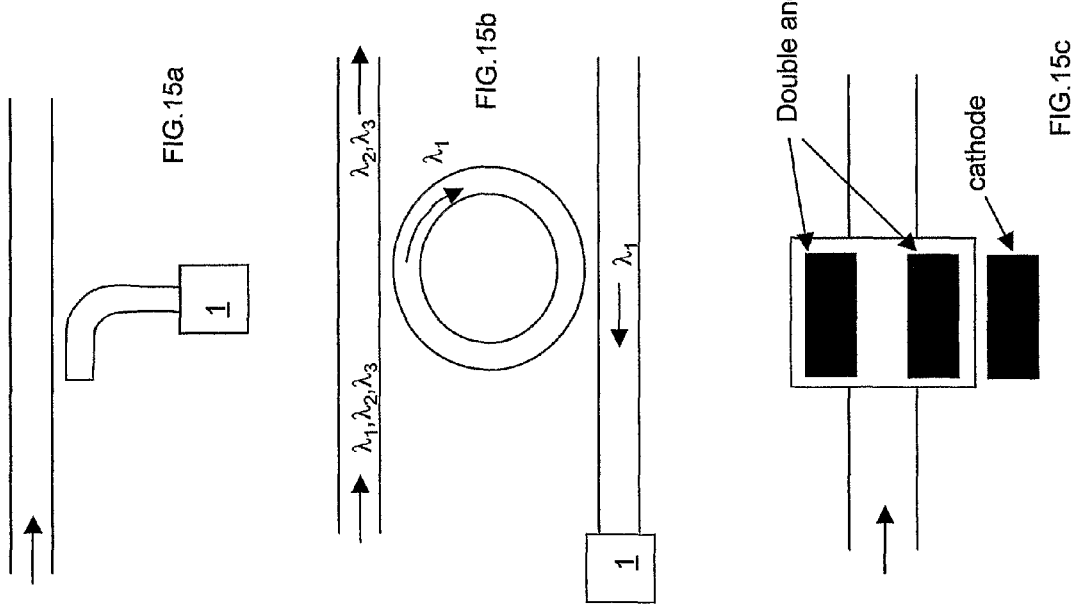
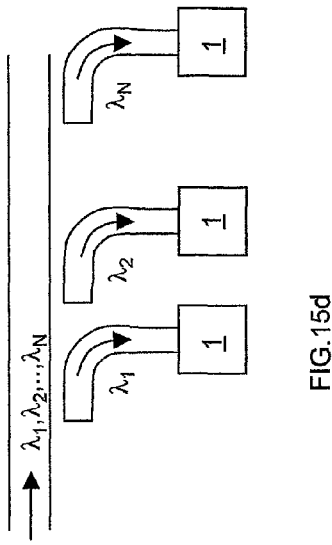
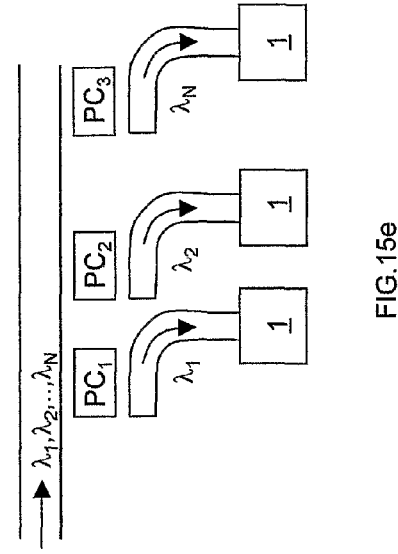
FIG. 15a
FIG. 15b
FIG. 15c
FIG. 15d
FIG. 15e

PHOTODETECTOR IN GERMANIUM ON SILICON

CROSS REFERENCE TO RELATED APPLICATION

This application is a national phase application based on PCT/EP2004/014714, filed Dec. 24, 2004, the content of which is incorporated herein by reference.

TECHNICAL FIELD

The present invention relates to a photodetector realized in germanium on silicon, particularly a photodetector for near-infrared application. The selected geometries of the photodetector allow to achieve a good responsivity and excellent speed of the overall device.

TECHNOLOGICAL BACKGROUND

The introduction of fiber-based optical communication has brought a great increase of long haul telecommunications: the inherent low cost, wide bandwidth and small attenuation of fibers are key factors in prevailing over copper wire. In short haul access network, however, fiber qualities are superseded by the current high costs of optical transceivers. These components are usually hybrid assembly of III-V devices such as lasers, modulators, photodiodes and waveguide.

In order to succeed, novel approaches for transceiver fabrication are required. Among others, silicon-based opto-electronics is attractive because of its potential low cost, scalability and reliability and integration with the mature and unsurpassed silicon VLSI technology.

In addition, light detection in the near-infrared (NIR) region is of extreme importance in optical telecommunications, particularly when high bit rates and low power levels are involved. It becomes therefore crucial to employ NIR detectors that not only exhibit good sensitivity and speed in the spectral range on interest, but that can be closely interconnected to the to the driving/biasing and amplifying electronic circuits. Since the most common platform for electronic processing of signals is based on silicon, the integration of NIR photodiodes on standard silicon platform has been pursued in the past two-decades as a viable low-cost and high-efficiency solution to the growing request for compact semiconductors microsystems for optical signal processing.

Several approaches have been proposed, such as hybrid integration of III-V based devices (silicon optical bench SIOB) or monolithic integration of InGaAs on silicon.

Silicon-germanium (SiGe) has been considered a promising alternative to InGaAs, due to its large absorption coefficient in the NIR and good carrier transport properties. However, due to its relative lattice mismatch, the epitaxy of SiGe requires the use of appropriate buffer layers or other techniques which possibly hinder a seamless integration with CMOS Si-electronics. Nevertheless, a number of successful attempts have been reported to date.

In "*Si-based Receivers for Optical Data Link*", written by B. Jalali and published in Journal of Lightwave Technology, vol. 12, no 6, of June 1994, pages 930-935, a $Ge_xSi_{1-x}$ waveguide pin detectors grown by rapid thermal chemical vapour deposition is presented. A typical device structure consists of a $Ge_xSi_{1-x}$/Si multiple quantum well absorption layer, Si cladding layers approximately 1 µm thick, and $n^+$ and $p^+$ contact layers.

One of the most appealing attempts of designing NIR photodetectors that can be integrated with standard semiconductor technology is based on polycrystalline Ge mainly because of the low thermal budget required in the device fabrication. Polycrystalline films are deposited at low temperatures which guarantee a good compatibility with standard Si processing. The deposited films exhibit absorption spectra similar to those of monocrystalline Ge, but mobility and lifetimes are reduced.

In "*Monolithic integration of near-infrared Ge photodetectors with Si complementary metal-oxide-semiconductor readout electronics*" written by G. Masini et al. and published in Applied Physics Letters, volume 80, no 18, of May 2002, pages 3268-3270, a monolithic integration of an array of near-infrared Ge photodiodes on Si complementary metal-oxide-semiconductor (CMOS) electronics is reported. The chip, realized with standard very large scale integrated silicon techniques, hosts eight CMOS switches used to select one out of eight pixel. The photocurrent generated by the selected photosensitive pixel is fed to a transimpedance amplifier with an external feedback resistor R. The output is a voltage corresponding to the light intensity at the interrogated detector in the linear array. The latter encompasses eight poly-Ge/Si heterojunction photodiodes, each of them realized between the evaporated poly-Ge and the n-well left exposed in the Si substrate. Si areas are connected to metal pads. Additionally, silver was evaporated and lithographically defined in the shape of thin fingers on the central portion of the poly-Ge, to lower the series resistance.

In "*2.5 Gbit/s polycrystalline germanium-on-silicon photodetector operating from 1.3 to 1.55 µm*" written by G. Masini et al. and published in Applied Physics Letters, volume 82, no 15, of April 2003, a fast polycrystalline germanium-on-silicon heterojunction photodetector for the near-infrared is described. The poly-Ge-on-Si photodiodes are fabricated by thermal evaporation of germanium on a silicon n-type substrate held at a temperature of 300° C. The thickness of the resulting Ge film is 120 nm. After deposition, the detector area is defined by wet etching of square mesas 200× 200 µm² in size. The deposition and lithographic definition of Ag contacts complete the fabrication. Light is coupled to the active detector area through the substrate, transparent at the wavelength of interest. Therefore this device is fabricated for normal incidence detection and it exhibits a 1.3 µm responsivity of 16 mA/W, dark current below 2 mA/cm² and an operational speed higher than 2.5 Gbit/s.

Applicants attribute the low responsivity of this device to the small active region (i.e., depletion layer plus one diffusion length), which can be typically of 50 nm in Ge on Si, associated to the large acceptor-like defect-density typical of polycrystalline germanium. Applicants believe that an increase in responsivity is expected in waveguide geometry where the absorption efficiency depends on the detector length rather than on the thickness of the active layer (such as in normal incidence detectors).

In "*Near-infrared waveguide photodetector based on polycrystalline Ge on silicon-on-insulator substrates*", written by G. Masini et al., published in Optical Materials 17 (2001), pages 243-246, an integration of a poly-Ge photodetector with a waveguiding structure is depicted. This approach allows the distributed absorption of the incoming light in the thin sensitive layer of the poly-Ge/Si heterojunction, thus increasing the effective absorption length and efficiency. Bond and Etch-back Silicon-on-Insulator substrates with 2 µm thick n-type silicon and 1.5 µm thick $SiO_2$ insulator are chosen as substrates. Polycrystalline Ge films were grown by thermal evaporation using a 99.999% purity commercial source. Film thickness is selected to be 120 nm. The device responsivity was measured at normal incidence (shining light from the substrate) and in the waveguide configuration. In both cases a semiconductor laser emitting 5 mW at 1.3 μm was used. From experiments, an increase in responsivity by a factor 8 has been shown in the waveguide configuration as compared to the normal incidence.

Applicants note that in this article a planar waveguide configuration of the photodiode is used, where the light is not confined laterally. The light signal travelling in the waveguide rapidly diverges in the waveguide plane, where confinement is not present. Due to this divergence, the light intensity (Watt/cm$^2$) decreases and it becomes necessary to increase the area of the photodetector to maintain a good efficiency. However, by increasing the photodetector area, the overall speed of the device can be reduced.

In US patent application n. 2004/0188794 in the name of Prakash Gothoskar et al., a photodetector for use with relatively thin (i.e. submicron) silicon optical waveguides formed in a silicon-on-insulator structure is disclosed. The photodetector comprises a layer of poly-germanium disposed to couple at least a portion of the optical signal propagating along the silicon optical waveguide. The silicon optical waveguide may comprise any desired geometry, with the poly-germanium detector formed to either cover a portion of the waveguide or be butt-coupled to an end portion of the waveguide.

Applicants note that in all embodiments of the cited patent application, the electrical contacts are formed at the opposite ends of the detector, i.e. they are both in contact with the poly-germanium layer. In addition, the poly-Ge layer comprises a p-i-n structure, having a p-doped poly-germanium layer, an intrinsically doped layer and an n-doped layer. Applicants have observed that a p-i-n structure in poly-Ge is difficult to realize, especially with deposition technologies that employ relatively low temperatures. Relatively low deposition temperatures, i.e., not larger than 350-400° C., are desired in order to preserve compatibility with standard silicon CMOS technology.

SUMMARY OF THE INVENTION

The invention is relative to a waveguide photodetector structure comprising a germanium layer, preferably a poly-crystalline germanium layer (in the following shortened in "poly-Ge" layer), deposited on a silicon substrate. In particular, the selected photodetector geometry is such that the performances of the device, with emphasis on its speed of response and its responsivity, are optimised.

The photodetector of the invention comprises a heterojunction between a layer of poly-Ge and a silicon layer. Preferably, the heterojunction is a p-n junction between a p-type poly-Ge layer and an n-type silicon layer. Near the p-n junction, electrons diffuse across to combine with holes, creating what is called a "depletion layer". The surface in which the p-n junction is present (i.e. the area corresponding to the depletion layer) is called "active area" of the photodetector structure.

Applicants have noted that one of the main drawbacks of poly-Ge photodetectors in normal incidence detection is the relatively small thickness of the active layer of the poly-Ge heterojunction, e.g., about 50 nm for thermally evaporated poly-Ge. This small thickness, regardless of the poly-Ge layer total thickness, limits the responsivity of the device to a certain (small) value in normal incidence detection. With the term "normal incidence detection" it is meant that the light to be detected is incident substantially perpendicularly to the plane defined by the heterojunction (i.e. the plane defined by the boundary between the two different materials forming the junction).

In order to overcome the mentioned problem, a waveguide geometry is adopted in the present invention. In a "waveguide geometry", optical signals to be detected travel in a waveguide, which may have any preferred geometry, and are vertically confined therein. The dimensions of the waveguide are such that an optical mode propagating in the waveguide has an evanescent tail which extends beyond the waveguide layer and thus the mode itself is sensitive to the presence of additional layer(s) eventually located on a surface of the waveguide.

The above-mentioned poly-Ge layer is deposited directly over the waveguide, which is a silicon-based waveguide in order to form the aforementioned p-n junction: as the signal propagates along the waveguide, it is coupled and then absorbed into the poly-Ge layer, creating electron-hole pairs. The presence of a buffer layer between the poly-Ge layer and the Si waveguide, although less preferred than the direct deposition of poly-Ge on Si, is not excluded. For instance, a buffer layer of Si slightly differently doped than the Si waveguide could be included in the photodetector structure.

Thus, a photodetector structure having a "waveguide geometry" means that optical signals to be detected travel substantially along the same direction of the interface between the poly-Ge and the waveguide, i.e., the p-n junction, and optical absorption takes place along the light propagation path in the overlap region between the photodetector active area and the guided mode profile of the mode travelling in the waveguide. In other words, light travels substantially perpendicularly to the direction of photogenerated carrier drift.

In this way, the light is absorbed into the thin sensitive layer of the poly-Ge/Si heterojunction in a distributed way, during propagation. This releases the strong constraint of device thickness being larger than $1/\alpha$, (where $\alpha$ is the absorption coefficient) in order to maximize absorption efficiency.

The band gap of the germanium ensures effective absorption of near infrared (NIR) light. The photodetector structure of the invention is therefore preferably used for NIR light detection.

In addition, the use of a waveguide for light in-coupling is appealing for telecom applications where signal is transported along an optical fibre/waveguide. According to the invention, the photodetector structure has a particular geometry of the poly-Ge layer, so that an optical signal is confined both vertically and laterally therein. In detail, the photodetector comprises a rib structure, i.e., the poly-Ge layer comprises a mesa structure, called in the following simply "mesa" having a given length L, a width W and a thickness T, where W<L. It is to be noted that within this context with mesa structure or mesa it is not necessarily meant a planar top surface of poly-Ge (although preferred). For example, a rib-shaped or ridge-shaped poly-Ge layer could be envisaged.

This mesa is in contact with the waveguide surface, preferably its top surface, and the area W×L defines the active area of the photodetector, being the area in which light is absorbed. The mesa is located so that the length L is the length along the signal propagating direction in the waveguide, while W is the width of the mesa in the direction substantially perpendicular to L. Light in the absorption region is confined both vertically and laterally. In particular, light is vertically confined by the planar waveguide that has a higher refraction index than that of the underlaying layer(s), while lateral guiding is obtained by the higher index of the lateral region corresponding to the poly-Ge mesa (i.e., substantially corresponding to the width W of the mesa). Two dimensional confinement preserves high light intensity (Watt/cm$^2$) and allows smaller area devices with benefits in term of speed due to the reduced junction capacitance. In the preferred embodiments, the silicon waveguide forms with the underlaying layers a silicon-on-insulator (SOI) structure.

The electron-hole pairs generated due to the absorption of light can be efficiently collected using suitable metal contact structures fabricated according to the teaching of the invention.

In the preferred embodiments, the thickness T of the poly-Ge layer, i.e. of the mesa, is chosen in such a way that a suitable compromise is found between the losses due to the metal top contact(s), which suggest a preferred lower limit in thickness of poly-Ge layer, and the losses present in the Ge-region above one diffusion-length, which suggest a preferred upper limit in the thickness of the layer. In other words, a large poly-Ge thickness increases the amount of light absorbed but not converted into photocurrent at the contacts. However, due to the presence of the metal contacts, T cannot be arbitrarily lowered due to the increase of metal losses.

On one hand, the length L of the poly-Ge layer is preferably kept as small as possible in order to achieve low capacitance and, therefore, preserve bandwidth. On the other hand, the length L is preferably longer than the absorption length so that nearly complete absorption is obtained. The preferred range of the length of the poly-Ge mesa in the photodetector of the present invention is $10 \, \mu m \leq L \leq 2000 \, \mu m$, more preferably L is comprised between $400 \, \mu m \leq L \leq 1000 \, \mu m$.

The width W of the poly-Ge layer is preferably kept relatively low and in general minimized in order to limit the number of propagation modes and to maximize light intensity. However, calculation shows that losses due to the metallic contacts of the cathode (metal contact over the silicon waveguide) cannot be neglected for $W<10 \, \mu m$. The width W therefore is preferably larger than $10 \, \mu m$ and it depends on the shape of the contacts themselves.

According to the invention, the photodetector comprises a first and a second metal contact, the first metal contact (anode) is located above the poly-Ge mesa and the second metal contact (cathode) is located on the silicon waveguide at both sides of the mesa.

Preferably, the first metal contact has a length equal to the length L of the active area of the photodetector. More preferably, the first metallic contact is located on the top surface of the mesa symmetrically with respect to the longitudinal axis of the mesa itself.

According to a first preferred embodiment, the first contact covers completely the poly-Ge mesa, i.e. it has a length L and a width W. Being the first metal contact relatively wide, metallic losses can be relevant. Preferably, according to the first embodiment, the thickness T of the poly-Ge layer is comprised within $100 \, nm \leq T \leq 160 \, nm$ in order to reduce the losses in the photodetector. Additionally, the preferred width W of the poly-Ge according to the first preferred embodiment is $10 \, \mu m \leq W \leq 50 \, \mu m$.

The distance d between the first and the second metal contacts is preferably minimized in order to minimize the series resistance of the photodetector. However, the metal contacts should not be too laterally close one another to prevent parasitic capacitance. Preferably, $10 \, \mu m \leq d \leq 20 \, \mu m$.

According to a second embodiment of the present invention, which differs from the first preferred embodiment only in the shape of the first metallic contact, this latter comprises two metallic strips located on top of the poly-Ge mesa. Preferably, the first metal contact comprises two metal strips located symmetrically with respect to the poly-Ge layer and embracing the same. The two strips are connected with one another, such as in a U-shaped metal structure on top of the poly-Ge.

The first and second strips have a width w and are preferably disposed symmetrically with respect to the longitudinal axis of the mesa. More preferably, the two metallic strips are at a relatively small distance from the edge of the top surface of the mesa.

The width w of the two metallic strips is preferably minimized in order to minimize the metallic losses. Preferably, $2 \, \mu m \leq w \leq 10 \, \mu m$.

Due to the reduction of the metal losses in the second embodiment, the above mentioned constraints in terms of the upper and lower limit for T' can be largely softened and the thickness T' of the poly-Ge layer in this second embodiment can be selected within a wider range of values than in the first embodiment, preferably $60 \, nm \leq T' \leq 200 \, nm$ and more preferably $80 \, nm \leq T' \leq 180 \, nm$.

BRIEF DESCRIPTION OF THE DRAWINGS

Further features and advantages of a photodetector in germanium on silicon according to the present invention will become more clear from the following detailed description thereof, given with reference to the accompanying drawings, where:

FIGS. 15a-15e show schematic diagrams of several applications of the photodetector of the invention. In particular: FIG. 15a is a conventional tap off configuration, 15b is a wavelength selective ring resonator based sampling, FIG. 15c is an in-line detection/monitoring, FIG. 15d is a multiple tap off for wavelength division multiplexing (WDM) and FIG. 15e is an improved selectivity version of WDM tap off based on photonic crystals.

PREFERRED EMBODIMENTS OF THE INVENTION

Figure 1:
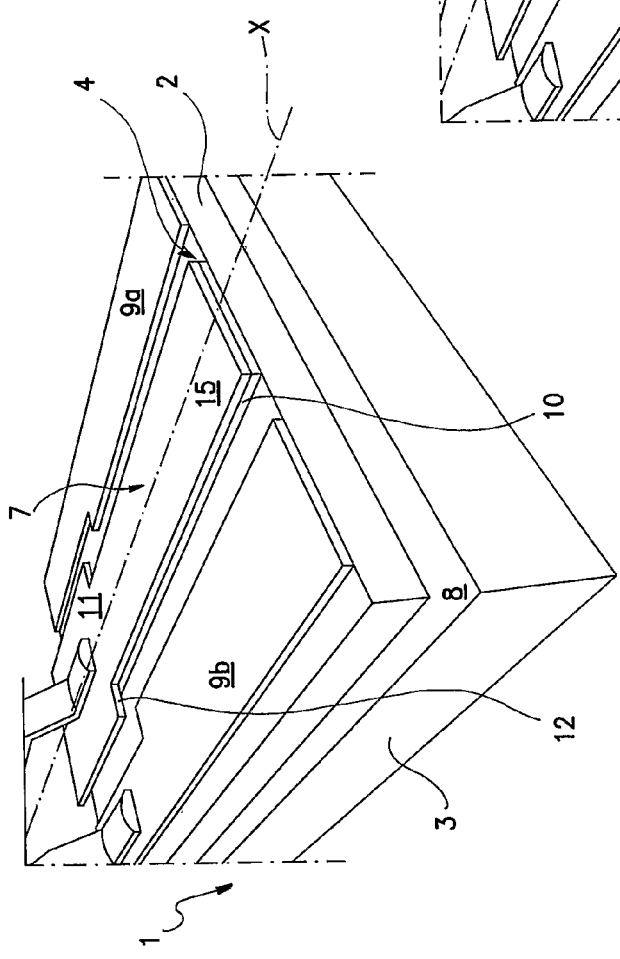
FIG. 1 is a schematic prospective view of a first embodiment of the photodetector of the present invention.
Figure 5A:
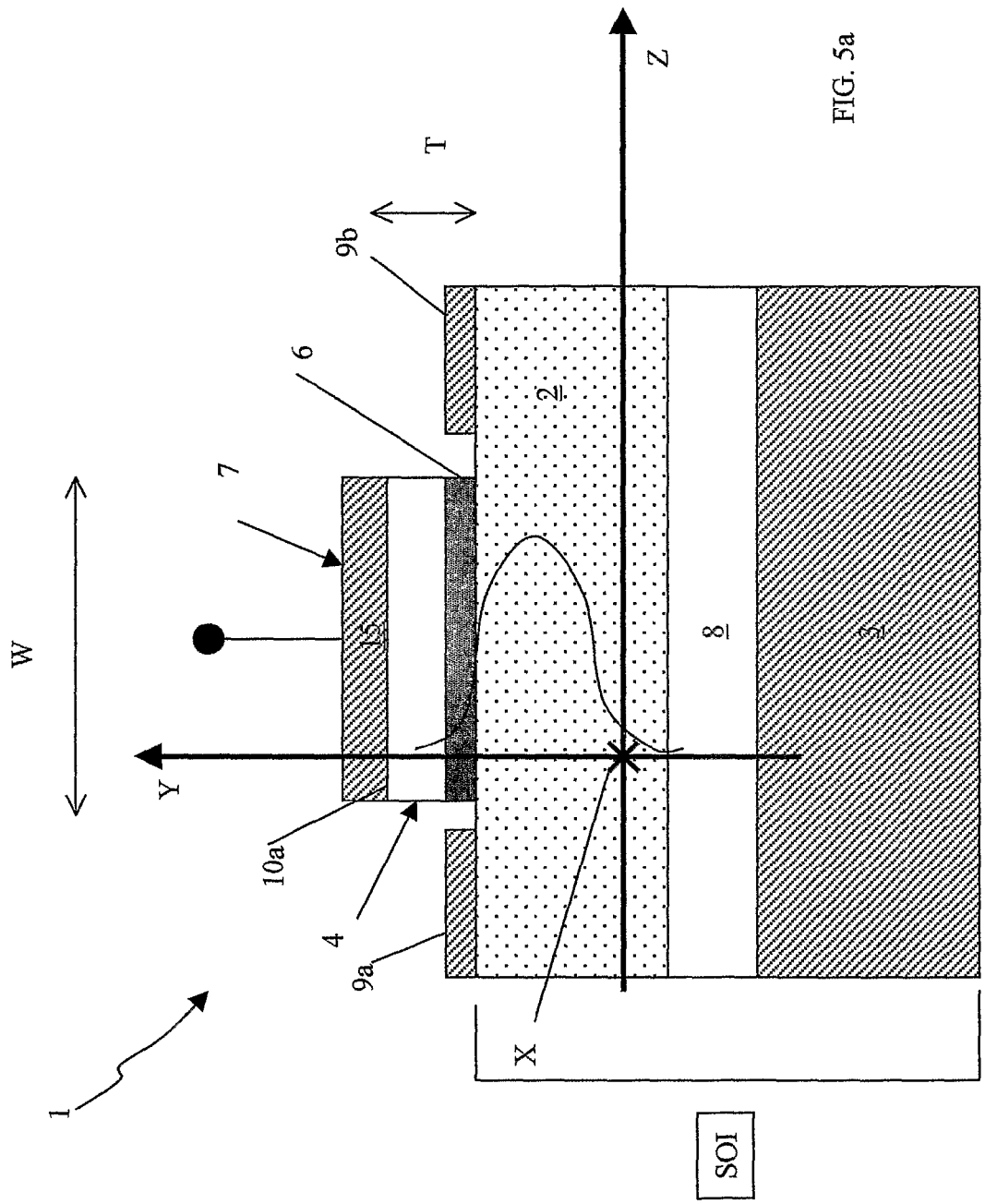
FIGS. 5a-5c are lateral cross sectional views of the photodetector of FIG. 1 (5a), FIG. 2 (5b) and of an additional embodiment of the photodetector of the invention, showing the mode profile of the mode traveling in the waveguide and its overlap with the active layer.

With initial reference to FIG. 5a, 1 indicates a photodetector structure realized according to the teaching of the present invention.

The photodetector structure 1 comprises a silicon-based waveguide 2 in which optical signals travels along a given direction X (which is also the axis of the waveguide) and are confined therein.

In particular, the optical signals are vertically confined in the waveguide.

With the term "silicon-based" waveguide, it is meant a waveguide realized in silicon, preferably n-type silicon material. Preferably, the waveguide dimensions are such that the mode traveling therein is not fully confined vertically in the waveguide itself, but an evanescent tail of the mode extends outside the waveguide, so that the mode may be influenced by the location of additional layers on a waveguide's surface. Additionally, the waveguide geometry is arbitrary, i.e. a slab, rib or ridge waveguide, may be alternatively used depending on the final desired application of the photodetector structure 1. As an example, a different waveguide geometry is used in the photodetector depicted in FIG. 5c.

Preferably, the waveguide 2 is realized on a layer 8, which has a refractive index lower than that of the waveguide. Preferably, layer 8 is a $SiO_2$ layer. More preferably, the $SiO_2$ layer 8 is realized on a substrate 3. Substrate 3, layer 8 and waveguide 2 form a silicon-on-insulator (SOI) structure, in which preferably the substrate 3 is made of silicon and the waveguide (SOI overlayer) is n-doped Si.

Preferably, the thickness of the waveguide 2 is comprised between 2 and 3 µm in order to obtain a convenient vertical confinement and minimal losses (i.e. in order to couple the fundamental vertical mode only and to make light coupling easier).

A polycrystalline Ge layer 4 is then grown on top of the silicon-based waveguide 2. Suitable techniques might be thermal evaporation, sputtering and chemical vapour deposition, being the first two preferred because of the inherent compatibility with silicon technology. Preferably, during poly-Ge deposition, the temperature of the substrate is kept above 250° C. (for example around 300-350° C.) so that the deposited germanium layer has a polycrystalline structure. In this case, its absorption spectrum is very similar to pure (bulk) crystalline germanium. The relatively low temperature at which the substrate is kept during poly-Ge deposition allows a controlled deposition without affecting either the functionality or the performance of possible additional Si electronics already present on the substrate.

Although the preferred embodiments of the present invention, which will be described in details below, refer to polycrystalline germanium, a photodetector device having a germanium layer with a (mono)crystalline structure, i.e. c-Ge, or a crystalline layer of SiGe can be also included within the scope of the invention. Crystalline germanium or SiGe could be grown epitaxially on silicon. SiGe may have a Ge concentration ranging from a few percent to 100%, preferably not smaller than 50%. However, crystalline Ge or SiGe are less preferred if compatibility with standard semiconductor technologies is desired, since their fabrication generally require relatively high growth temperatures.

After deposition, the poly-Ge layer 4 is etched, in order to obtain the desired geometry. According to the invention, the poly-Ge layer 4 is etched so as to form a mesa 10 having length L in the direction of signal propagation X in the waveguide and a width W in a direction Z substantially perpendicular to the propagation direction but laying in the same plane. It is therefore identified a "detector area", or "active area" given by L×W in which light absorption takes place.

Additionally, the thickness of the poly-Ge mesa 10 is identified in the following with T.

The combination of the silicon-based waveguide 2 in contact with the poly-Ge layer 4 form a p-n heterojunction. Preferably, the poly-Ge layer is p-type and the Si-waveguide is n-type, however the reverse doping is also included in the present invention (i.e., n-type poly-Ge on p-type Si). A p-type germanium is preferred when thermal evaporation is employed for fabrication of the layer 4, because the grown Ge layer turns out to be p-type without the need of an additional step of doping (e.g., by diffusion or ion implantation). Conversely, an n-type Ge layer grown by thermal evaporation and generally by other standard growth techniques, such as chemical vapor deposition, would require an extra process step for the doping of the layer.

The absorption of the propagating light signal in the waveguide takes place along the light propagating path where the poly-Ge layer, in particular the mesa 10, is present. An active layer 6 (schematically depicted in FIGS. 5a-5c) is formed at the poly-Ge/Si interface: when an incident photon reaches this region, due to the fact that the evanescent tail of the propagating mode in the waveguide 2 couples into the poly-Ge layer 4, it "splits" in an electron-hole pair. The electrons that are generated by the absorption of photons are collected perpendicularly to the propagating mode vector by way for example of an electric field applied at the p-n junction (reverse bias), as described in the following.

Due to the fact that the photon absorption takes place along the signal propagating path, the absorption efficiency mainly depends on the detector length (i.e. on the poly-Ge mesa length L) rather than on the thickness of the active layer.

According to a first characteristic of the present invention, the optical signal traveling in the waveguide 2, has to be confined both laterally and vertically in the poly-Ge layer 4. In particular, the poly-Ge mesa dimensions are so selected that W<L. As already mentioned, two dimensional confinement preserves high light intensity (Watt/cm$^2$) and allows smaller area devices to benefit from an improved speed due to the reduced junction capacitance.

The optical lateral confinement may be due to the poly-Ge mesa geometry, however, the geometry of the silicon waveguide 2 can also influence the optical lateral confinement. In a further embodiment of the photodetector structure of the invention, which is illustrated in FIG. 5c and indicated as 1", the waveguide 2 is etched in order to form a ridge below the poly-Ge mesa 10 and thus enhancing the lateral confinement.

Preferably, the length L of the poly-Ge mesa 10 is comprised between 10 µm≦L≦2000 µm, more preferably between 400 µm≦L≦1000 µm. The preferred L for a specific application is selected according to the best compromise between the desired efficiency and speed of the device, which depend, among other, on W, L and the thickness T of the mesa.

The electrons generated by the light absorption are collected through electrodes, or contacts, appropriately located on the photodetector.

Figure 3:
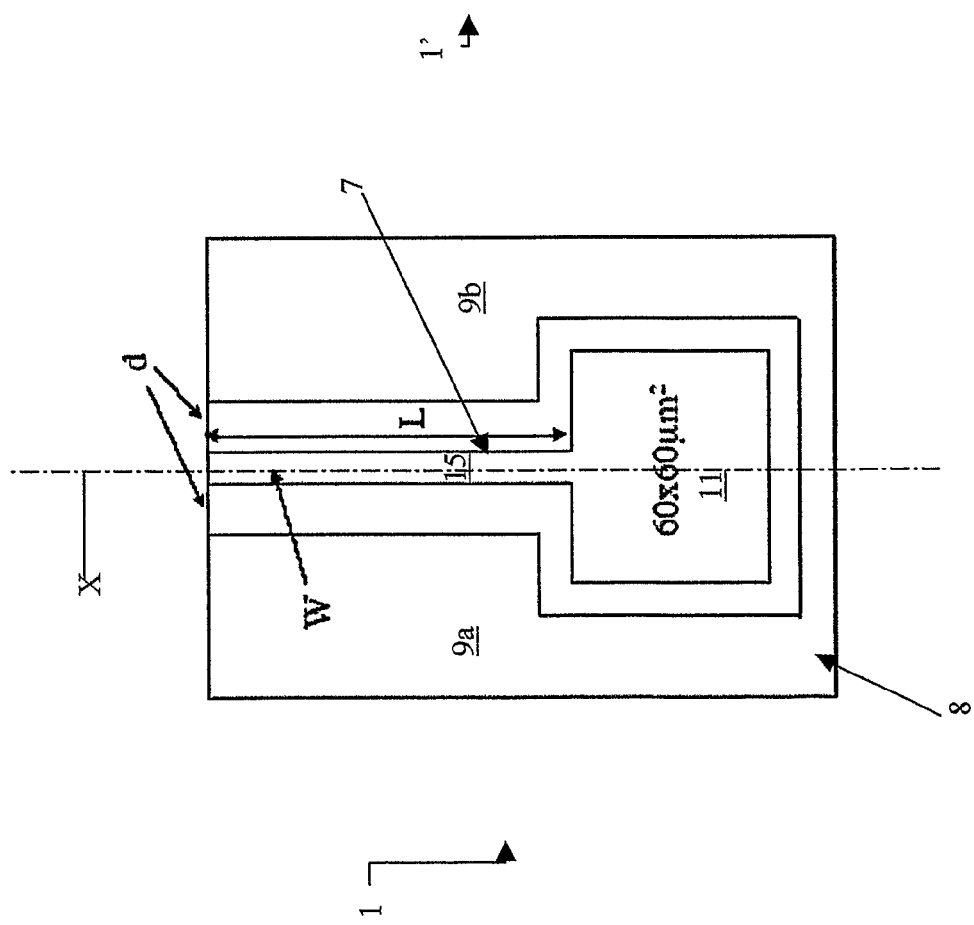
FIG. 3 is a top view of the photodetector of FIG. 1.

In a first preferred embodiment of the invention, shown in FIGS. 1, 3 and 5a, a first metal contact 7 is placed on a top surface 10a of the poly-Ge mesa 10. Preferably, the first contact 7 (anode) comprises a metal strip 15 disposed substantially parallel to the optical signal propagation direction X (in the figures the X axis is depicted as coincident to the longitudinal axis of the mesa 10). Even more preferably, the metal strip 15 has a length equal to the length L of the poly-Ge mesa 10. In particular, according to this first preferred embodiment, the first metal contact covers the poly-Ge layer 4 completely, following the profile of its top surface 10a and thus defining a metallic strip of width W and length L.

A second metal contact (cathode) is placed on top of the silicon-based waveguide 2. The first and second contacts collect the electrons generated by the photon absorption in the active region L×W. Preferably the second contact has the form of a strip. More preferably, the second contact comprises two metallic strips 9a, 9b located on the waveguide 2 symmetrically with respect to the poly-Ge layer 4, i.e. they "embrace" the poly-Ge mesa 10 and lay parallel to the latter. The two symmetric metallic strips 9a, 9b are also connected to each other.

According to a preferred embodiment of the invention, the photodetector 1 comprises a metal pad 11 to more easily connect the first metallic contact 7 to an external circuit (not shown) through wire bonding. Even more preferably, the poly-Ge layer 4 comprises a poly-Ge pad 12, from which the mesa 10 projects, on top of which the metal pad 11 is deposited, so that metal covers completely the upper surface of the poly-Ge layer 4, as it can be clearly seen in FIG. 3. In this figure the poly-Ge layer is not visible, being completely covered by the contact 7. Preferably, the poly-Ge pad 12 (and thus the metal pad 11) has a square shape and for example its dimensions are at least 60×60 $\mu m^2$. In case a metal pad 11 is present, the active area of the photodetector 1 is given by the L×W area plus the area of the pad.

The distance d between the first metallic contact 7 over the poly-Ge mesa 10 and the second metallic contact 9a or 9b over the silicon-based waveguide 2 is preferably minimized in order to minimize the series resistance of the photodiode 1, thus increasing its optical bandwidth. Applicants' calculations show that for a contacts' distance comprised in the range between 10 and 20 µm, the series resistance is dominated by the contact resistance of the second metal contact 9a, 9b. Thus, the preferred distance between the first and the second metal contact is 10 µm≦d≦20 µm.

Applicants have noted that the thickness of the poly-Ge layer 4 is a relevant parameter when it comes to the photodetector responsivity, especially in the preferred embodiment of FIGS. 1, 5a and 3. The maximum thickness of the active layer in the poly-Ge layer is of about 50 nm. Above this thickness, the absorbed light is lost (i.e. it does not contributed to detection). Indeed, electron-pairs that are generated far away from the depletion region travel primarily under the effect of diffusion and may recombine without giving rise to a current in the external circuit (connected to the photodetector through the contacts 7, 9a, 9b). This reduces the efficiency of the photodetector 1.

Conversely, a too small value of the poly-Ge thickness results in increased losses in the top metal contact 7. Since losses are due to absorption in metal and in the poly-Ge layer above one-diffusion length, a trade-off is expected.

Figure 6:
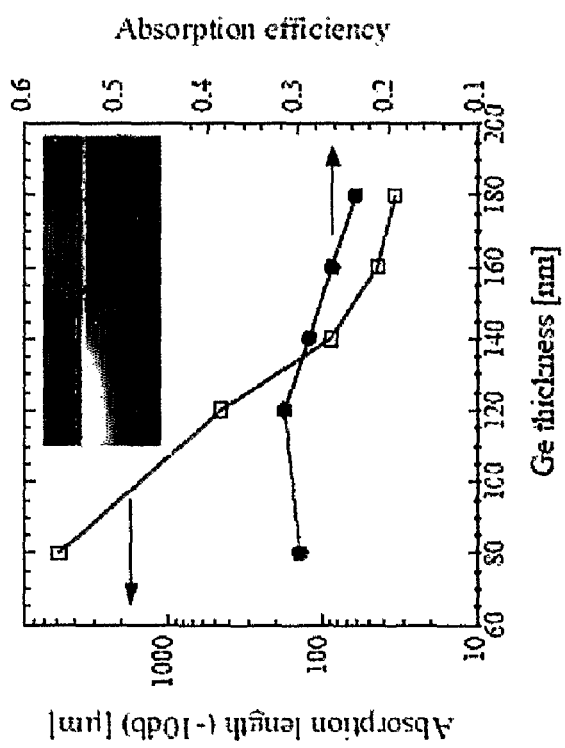
FIG. 6 is a graph showing the calculated absorption efficiency (right) and the length (left) versus the polycrystalline germanium layer thickness for a $W=10 \, \mu m$ of the poly-Ge layer in the photodetector of FIG. 1. Contacts are in Au.

Simulations have been performed by Applicants on the device according to the first embodiment of the invention which is illustrated in FIGS. 1, 3 and 5a, where the poly-Ge mesa 10 has W=10 µm and an L longer than the absorption length. Results of simulations are shown in FIG. 6. The left ordinate represents the absorption length, while the right ordinate the absorption efficiency. For each selected value of poly-Ge mesa thickness T (which is the abscissa of the graph of FIG. 6, the thickness is given in nm), the corresponding maximum absorption efficiency of the photodetector 1 is calculated and visualized as a dot in the graph of FIG. 6. For the same T-value, the absorption length (at 10 dB) is calculated (the calculated absorption length can be considered as the minimum length necessary to achieve nearly complete absorption) and it is marked as a square in the aforementioned graph. It can be clearly seen that the smaller the poly-Ge mesa thickness T, the longer is the absorption length (in other words L is inversely proportional to T).

A too long absorption length is not desiderable because the device becomes bulky and thus less suitable for small devices realization, as typically required in integrated circuit technology. L is also preferably kept small in order to have low capacitance and, therefore, preserve bandwidth. The proposed preferred length range 400 µm≦L≦1000 µm has been selected in order to be able to span up to total absorption (−10 dB) and up to a bandwidth of 10 GHz.

The expected trade-off caused by the above mentioned losses associated to the presence of the metallic anode on top of the poly-Ge layer 4 can be seen in the efficiency vs T curve of FIG. 6, which has a maximum at about 120 nm.

More generally, after having selected a preferred value or range of values of efficiency, which depends on the specific application of the photodetector, a range of suitable thickness for the poly-Ge mesa is available. According to simulations, preferably the selected poly-Ge thickness T is comprised between 100 nm and 160 nm.

Additionally, in this first embodiment of the invention, the preferred width W of the Poly-Ge mesa 10 is comprised between 10 µm≦W≦50 µm. Indeed, W is preferably minimized to limit the number of propagation modes into the Poly-Ge layer 4 and keep light intensity high. However losses in the metallic contact 7 increase for W<10 µm, which can be therefore considered a lower limit.

Figure 12:
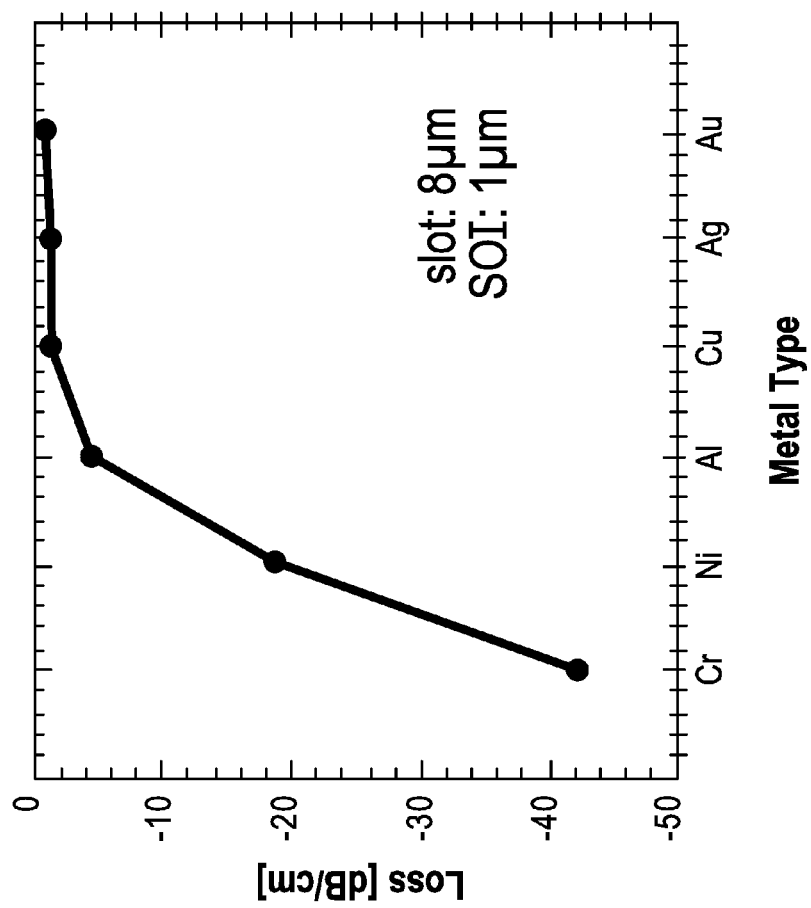
FIG. 12 is a graph of the metal losses of a waveguide for different metals used for the contacts.

Simulations suggest that the photodetector 1 of FIGS. 1, 3 and 5a is relatively sensitive to metal losses. Therefore, for the realization of the first and the second contact preferably a low loss metal is used. Preferred metals are Ag or Au. In FIG. 12, propagation losses due to the presence of the metal contact 9a,9b on a silicon-based waveguide 2 on a $SiO_2$ substrate 3 are shown for different contact metals.

According to different embodiments of the present invention, not shown, the first metal contact 7 may have the form of a metal strip of length L, but its width may be smaller than the width W of the poly-Ge mesa 10. In particular the contact 7 may have the form of a strip disposed on top of the poly-Ge mesa 10 parallel to the signal propagating direction X and extending along the length L, and it may be located in proximity of a border of the mesa upper surface, i.e. it may be in contact to the border of the rectangle W×L or it can be located at a given distance from that border. However, the presence of a single central strip would perturb the propagating optical mode around its maximum, driving the optical field away from the metal strip and thereby reducing efficiency.

The value of the dark current of the photodiode 1 has important implications on the overall power dissipation and noise performance through the associated shot noise. Typical measured dark current density/reverse bias (applied at the heterojunction) characteristics of the photodetector 1 of FIGS. 1, 3 and 5a are displayed in FIG. 8. The solid line represents the dark current density in the first preferred embodiment under issue. Therefore, the photodetector of the present embodiment exhibits a good reverse-bias behavior and dark current densities $I_d$ of 0.6 and 1 mA/cm² at 1 and 10 V, respectively, with a standard deviation <10%. The corresponding shot noise is evaluated from the measured $I_d$ according to $i_s=(2qI_dB)^{1/2}$, where q is the electron charge and B the bandwidth (considered in this calculation equal to 1 GHz). Typical values for a photodetector according to the first embodiment having W=9 μm, L=1 mm, T=120 nm (bonding pad is $10^{-3}$ cm²) are listed in Table 1:

TABLE 1

| Reverse Bias (V) | $I_d(A)$ | $I_s(nA)$ |
|---|---|---|
| 1 | 4.2 * 10⁻⁷ | 11 |
| 10 | 6.6 * 10⁻⁷ | 14 |
| 20 | 1.7 * 10⁻⁶ | 23 |

Figure 9:
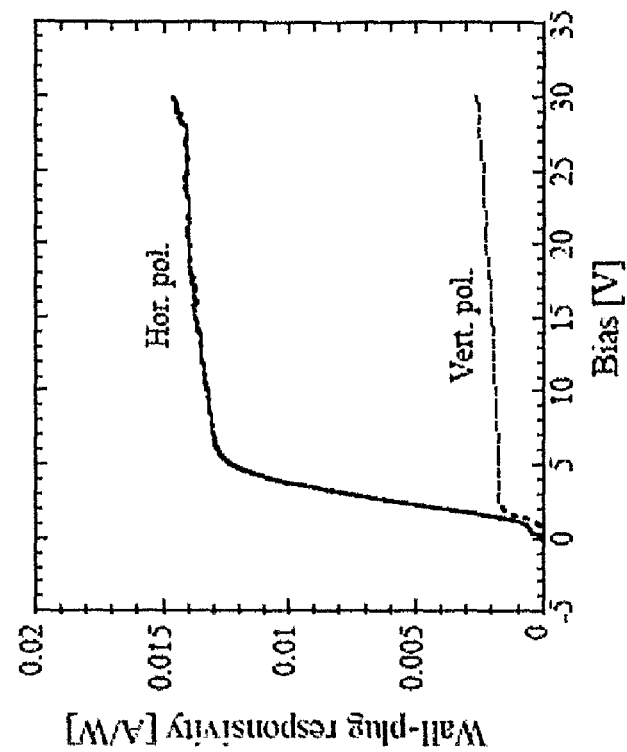
FIG. 9 is a graph showing typical wall-plug responsivity versus bias for both horizontal (solid line) and vertical (dashed line) light polarization of the photodetector of FIG. 1.

The responsivity of the photodetector of this embodiment has been measured by butt-coupling light from a semiconductor laser through a 40× objective and a half-waveplate for polarization. The photocurrent was converted to voltage and then measured by a lock-in amplifier versus reverse bias. Measurements of wall-plug responsivities defined as the ratio between the photocurrent and power at the lens input (i.e. with no correction for lens transmission, reflection and modal mismatch) are performed. Typical responsivities of photodetectors with T=120 nm, W=8 μm, L=600 μm at 1.55 μm versus reverse bias are shown in FIG. 9, for both horizontal (solid line) and vertical (dashed line) light polarization. It can be seen that wall-plug responsivities is comprised in the 10-15 mA/W range.

Figure 11:
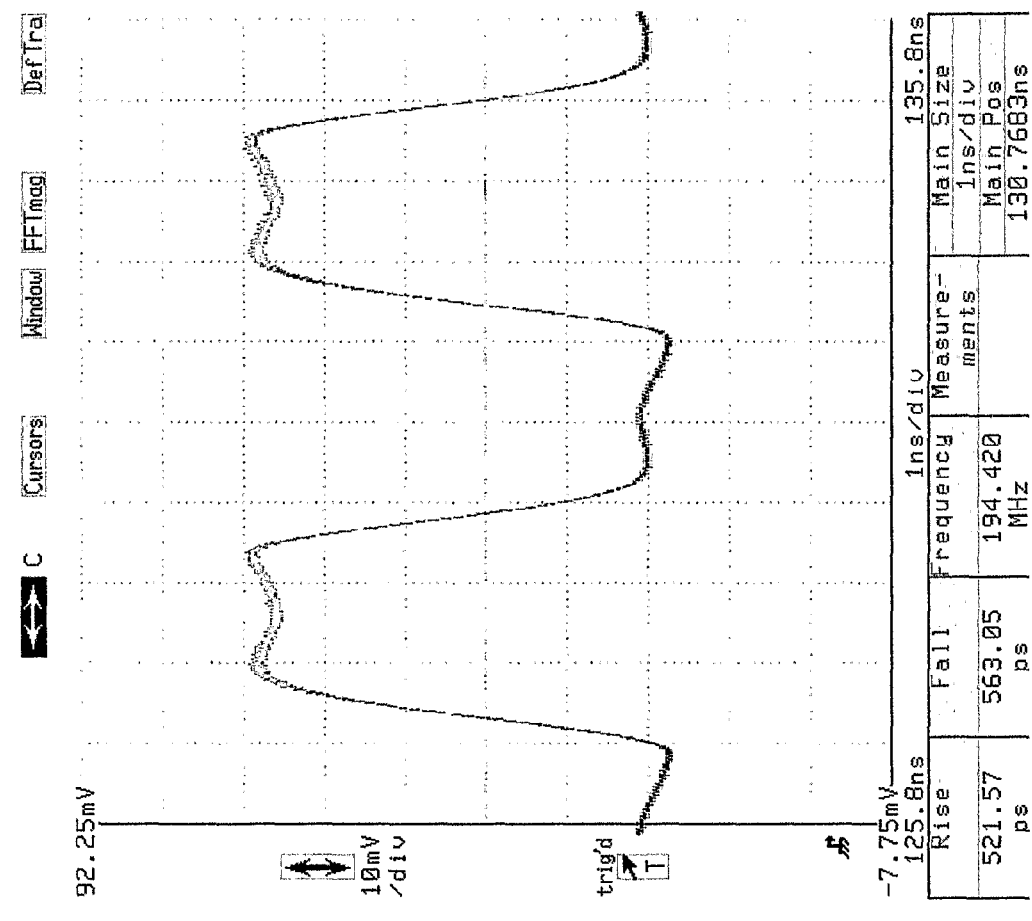
FIG. 11 is a graph showing the photoresponse of device 1 to a modulated light input at $1.55 \, \mu m$.

Finally, speed measurements have been performed. If the device is appropriately biased, the transit time associated to the crossing of the depletion layer is expected in less than hundred picoseconds and the bandwidth of the photodetector 1 is thought to be RC-limited, where R is the series resistance ($R_S$) plus load resistance $R_L$ and C the junction capacitance. Above 10 V reverse-bias, the silicon waveguide (having a thickness in the aforesaid measurements of 2 μm) is assumed to be totally depleted and the inferred junction capacitance is between 0.8 and 2.0 pF for device having L between 400 μm and 1200 μm and a 60×60 μm² metal pad. According to this range of capacitances and taking into account a 100 Ohm of load and series resistance, a bandwidth between 0.5 GHz and 2 GHz is expected. FIG. 11 displays the typical measured response for the photodetector 1 (with W=10 μm, L=100 μm and T=120 nm, bonding pad is 60×60 μm²) of FIGS. 1, 3 and 5a, and the plotted curve shows rise and fall times of about 500 ps. Rise time of 500 ps corresponds to bandwidth of approximately 0.7 GHz, which is in the expected range. Nevertheless, the measured series resistance $R_S$ exceeded 500 Ohm and it could be minimized (thus increasing the device speed) optimizing the ohmic character of the cathode contact.

EXAMPLE 1

A Bond and Etch-back SOI substrate with 2 μm-thick n-type Si overlayer (2-3 Ωcm) and 1.5 μm-thick SiO₂ insulator has been used. The samples were cleaved, but the input facets were un-polished.

Polycrystalline Ge film was grown by thermal evaporation using a 99.999%-purity commercial source and a tungsten crucible in vacuum with a background pressure of $10^{-6}$-$10^{-7}$ Torr. The substrate was heated by a massive copper-plate, temperature-stabilized at 300° C. by a thermo-coaxial cable. The Ge film thickness T was selected equal to 120 nm. Before the introduction into the vacuum chamber, the SOI substrate was chemically cleaned at room temperature by dipping them into buffered hydrofluoric acid (BHF) for 10 s. Poly-Ge mesa 10 was defined by lithography and selective wet-etching.

Aluminum contacts were subsequently deposited by thermal evaporation and defined by standard lithography. The square pad for wire bonding is of about 60×60 μm².

Several devices has been fabricated having different lengths between 400 and 2400 μm.

Figure 2:
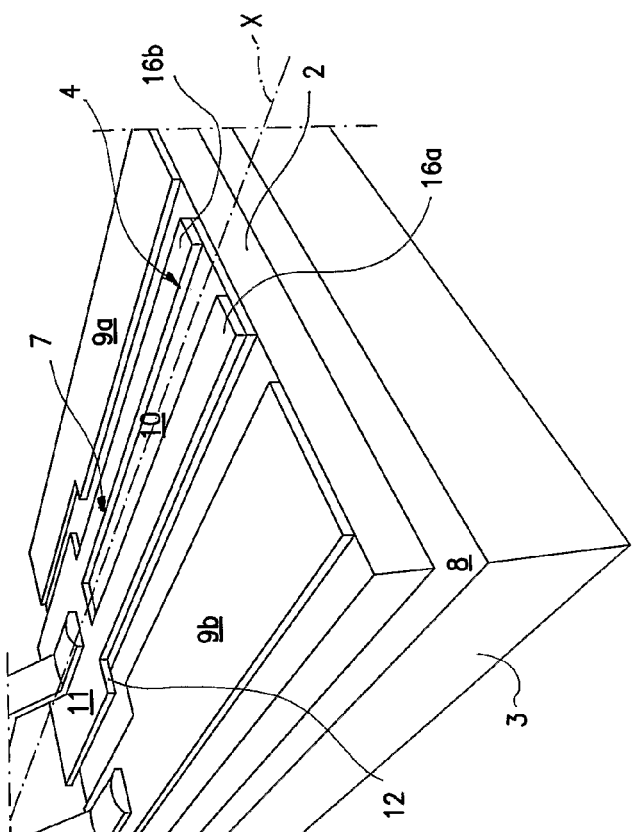
FIG. 2 is a schematic prospective view of a second embodiment of the photodetector of the present invention.
Figure 4:
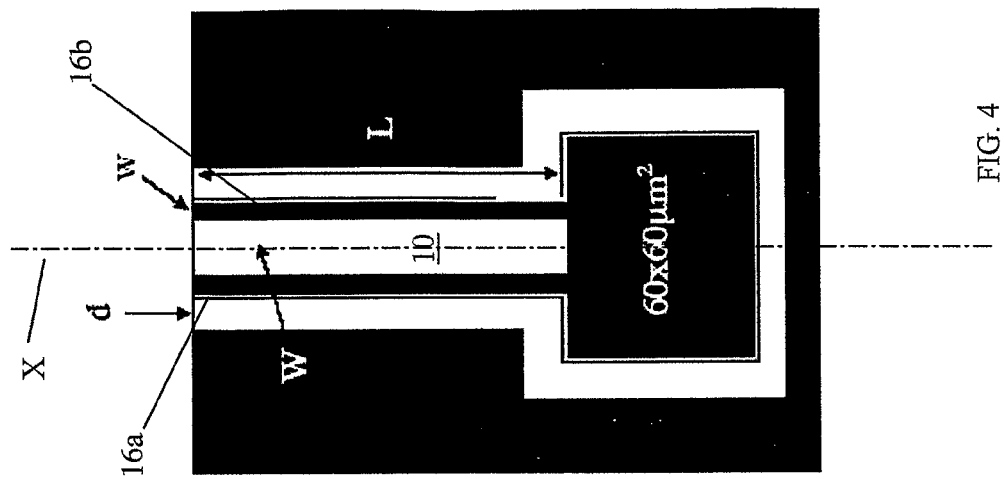
FIG. 4 is a top view of the photodetector of FIG. 2.
Figure 5B:
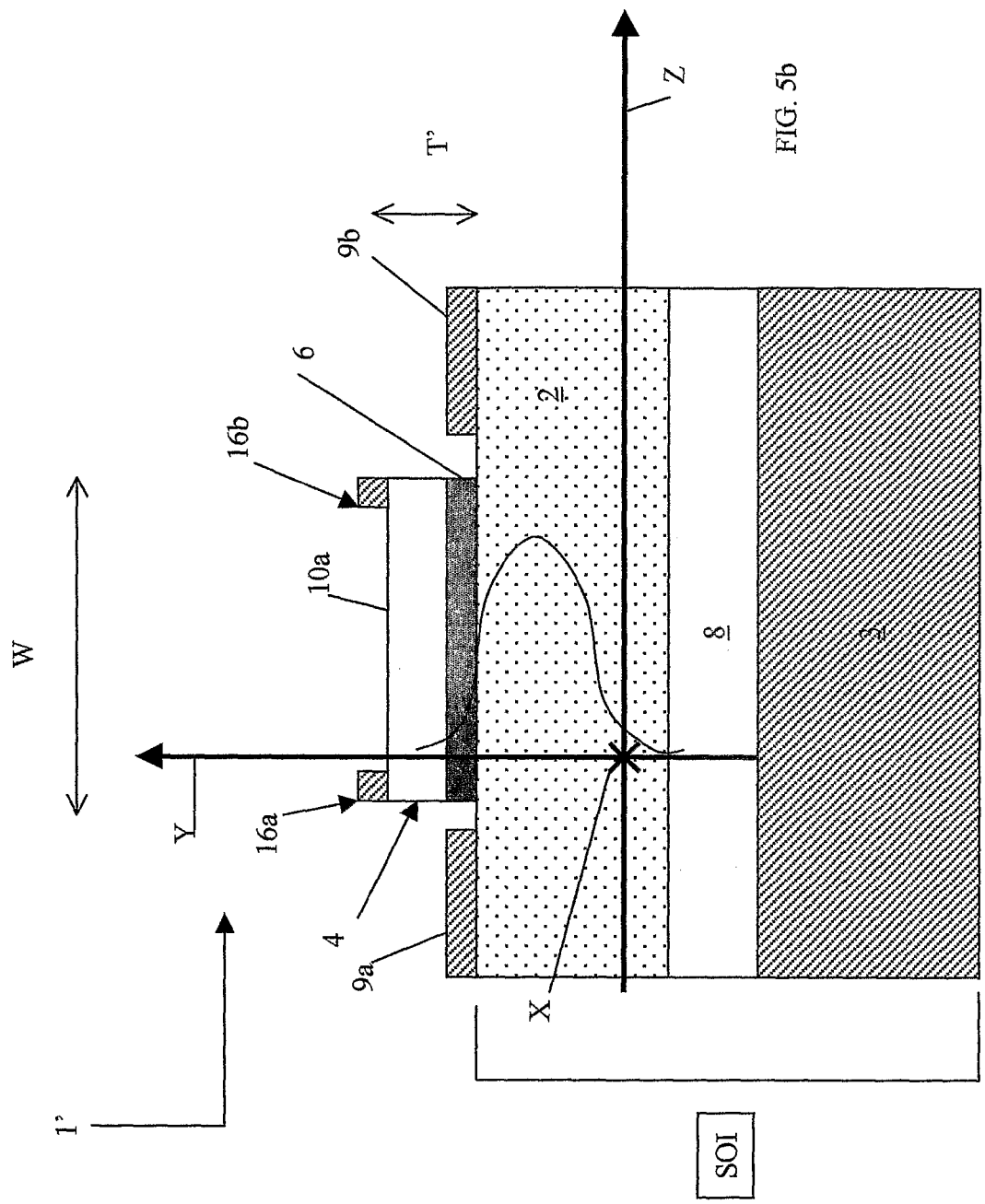
Figure 5C:
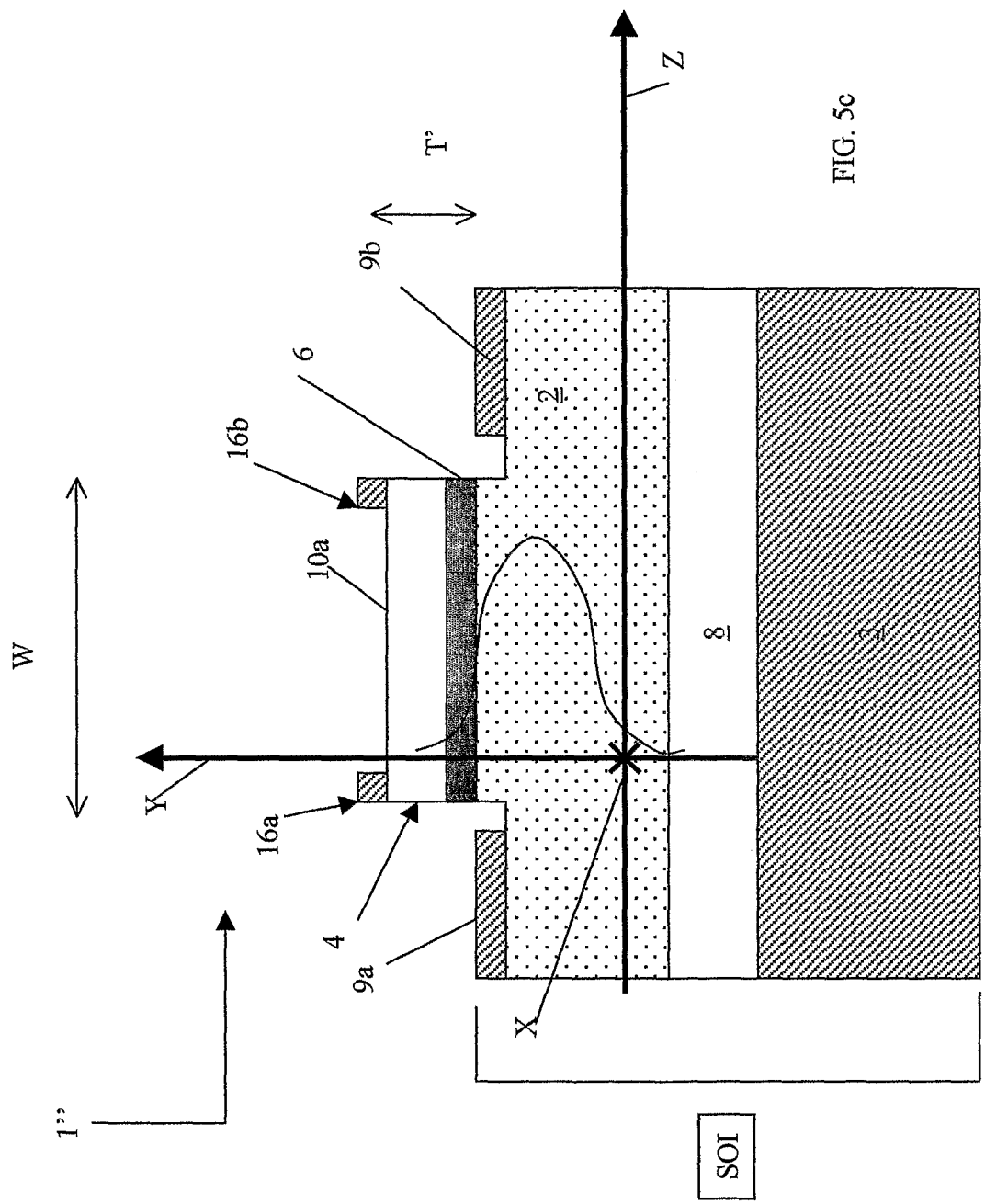

A second preferred embodiment of the photodetector according to the invention, indicated as 1' in the figures, is shown in FIGS. 2, 4 and 5b. An additional variant of this embodiment is shown in FIG. 5c where the geometry of the waveguide 2 is different from the geometry depicted in FIG. 5b. However this ridge waveguide of FIG. 5c may be alternatively employed also in the framework of the photodetector of the first embodiment. Identical reference numerals indicate in FIGS. 2, 4 and 5b/5c functionally identical parts with respect to the first preferred embodiment indicated with 1 of FIGS. 1, 3 and 5a.

The difference between the photodetector 1 and the photodetector 1' lies in the different shape and dimensions of the first metal contact deposited over the poly-Ge layer 4. In the photodetector 1' according to a second preferred embodiment, the first metal contact on the poly-Ge mesa comprises two metallic strips 16a, 16b, both having preferably length L and being disposed parallel one with respect to the other and also parallel to the propagating direction X. Preferably, the two strips 16a, 16b are disposed symmetrically with respect to the longitudinal axis X on top of the mesa 10. The width of these strips, indicated with w, is smaller than W/2. More preferably, the two strips have identical lateral dimensions.

This second embodiment of a photodetector structure 1' having two strips 16a, 16b located symmetrically with respect to the centre of the mesa upper surface 10a is preferred. It is to be noted that metal losses are much more relevant in the first embodiment (i.e., photodetector 1) than those in the second embodiment due to the larger contact dimensions of the former. A single lateral stripe could be used, but the resulting electric field distribution would not be optimised for photocarrier collection and series resistance might increase.

The two strips 16a, 16b are connected to each other, for example by means of the metal pad 11 (FIG. 4).

The second metallic contact 9a, 9b on the silicon-based waveguide 2 remains unchanged with respect to the first preferred embodiment.

Preferably, the two strips 16a, 16b are not adjacent to the boundary of the mesa 10, but there is a minimal distance between the edge of each strip and the edge of the mesa 10, to prevent the risk of short-cuts due to metal portions belonging to the first metal contact 7 contacting accidentally the silicon waveguide 2. This minimal distance is preferably of the order of 1 μm.

In the first embodiment of the photodetector of the invention, it has been shown (see FIG. 6) that losses due to the metal contacts are relatively relevant and for this reason the thickness T of the poly-Ge layer 4 is preferably not too small (i.e. it is thicker than about 100 nm). In this second preferred embodiment, the amount of metal present on the poly-Ge layer 4 is reduced with respect to the first embodiment and thus it is expected that losses in contacts are negligible, or at least reduced.

Figure 7:
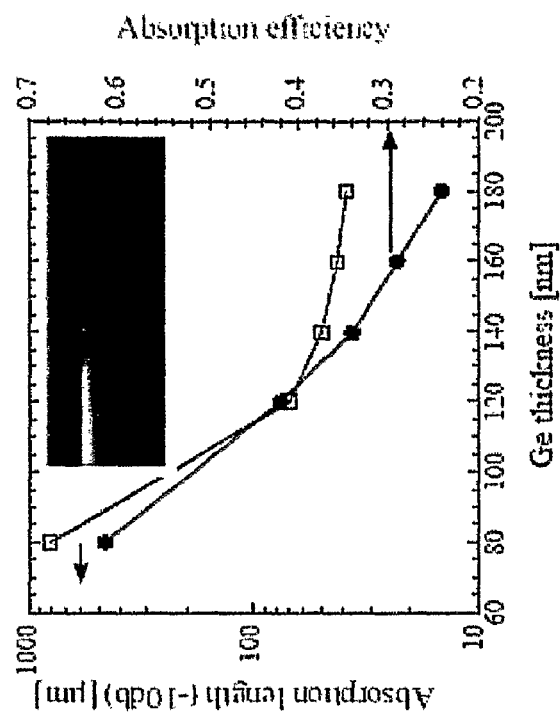
FIG. 7 is a graph showing the calculated absorption efficiency (right) and the length (left) versus the polycrystalline germanium layer thickness for a $W=30 \, \mu m$ of the poly-Ge layer in the photodetector of FIG. 2. Contacts are in Al and have a width $w=5 \, \mu m$.

As depicted in FIG. 7, the analogue curve for the second embodiment 1' of the curve depicted in FIG. 6 for the first preferred embodiment 1 is shown. In particular, simulations of the behaviour of a photodetector 1' having a poly-Ge mesa 10 of W=30 μm and a width of the two metal strips 16a, 16b both equal to w=5 μm are shown. The contacts 7, 9a, 9b are realized in aluminium. Due to the decrease of the metal losses, the efficiency of the photodetector 1' shows a monotonic behaviour versus poly-Ge layer thickness T' (in the first embodiment, this curve has a maximum). This latter parameter T' is therefore only limited by fabrication constraints as the roughness of the layer and by the minimum value equal to the active layer close to the Ge/Si interface (which is of about 50 nm) in order to have nearly complete absorption.

The preferred thickness T' of the poly-Ge layer 4 in this second preferred embodiment is therefore comprised between 60 nm≦T'≦200 nm and more preferably between 80 nm≦T'≦180 nm. This relatively wide range of preferred suitable thickness of poly-Ge layer allows more design flexibility and an expected improvement in responsivity. Again, a trade-off between responsivity and speed is generally selected.

On the other hand, due to the more complex geometry and to technological constraints given by the realization of two tiny parallel metal strips on the same surface of the Poly-Ge mesa 10, preferably the poly-Ge mesa 10 has a width W' wider than or equal to 20 μm. More preferably, the width of the mesa in this embodiment is 20 μm≦W'≦50 μm.

The width w of the strips 16a, 16b is preferably minimized to have a large covered-uncovered ratio, and it is also limited by the lithographic resolution. Preferably, 2 μm≦w≦10 μm.

The other preferred design parameters of the photodetector 1' of this second embodiment are equal to the ones mentioned with regard to the first embodiment 1, such as the value of the length L and the shape of the second metal contact 9a,9b.

The values listed in of Table 1 calculated for this second embodiment, in particular for a photodetector 1' having W=30 μm, w=5 μm, L=500 μm and T=120 nm, are shown below in Table 2:

TABLE 2

| Reverse Bias (V) | $I_d(A)$ | $I_s(nA)$ |
|---|---|---|
| 1 | $5.2 * 10^{-7}$ | 13 |
| 10 | $6.3 * 10^{-6}$ | 44 |
| 20 | $8.6 * 10^{-5}$ | 165 |

Figure 8:
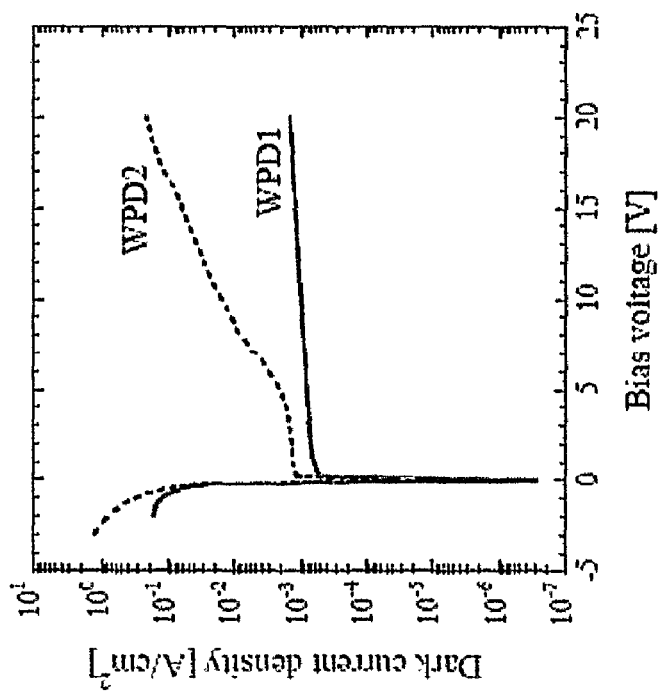
FIG. 8 is a graphs of typical current-voltage characteristics of the photodetector of FIG. 1 (solid line) and FIG. 2 (dashed line)

The typical measured current-voltage characteristics for the second embodiment of photodetector 1' is shown in FIG. 8 where the curve for the second embodiment is plotted using a dashed line.

Figure 10:
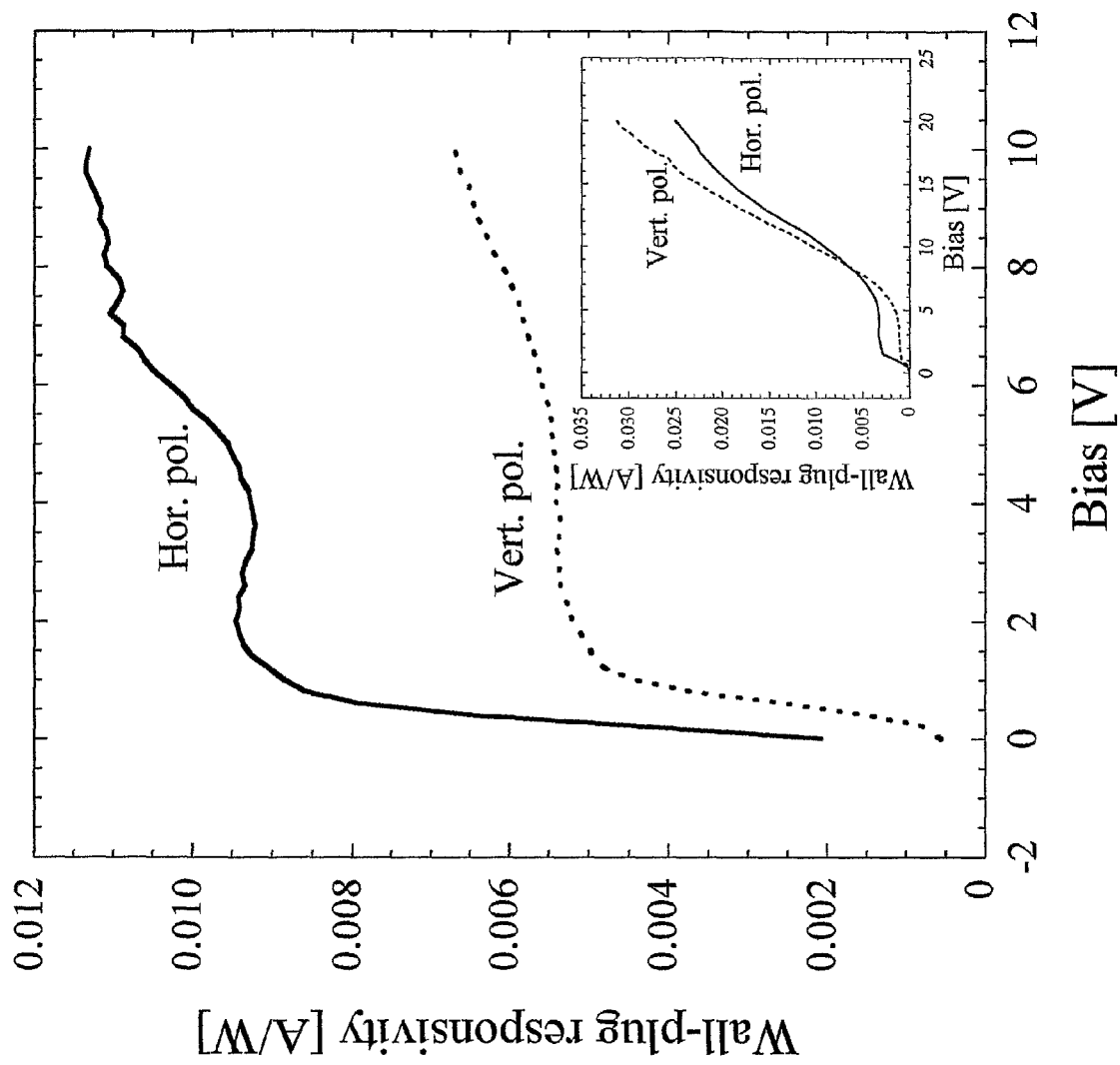
FIG. 10 is a graph showing typical wall-plug responsivity versus bias for both horizontal (solid line) and vertical (dashed line) light polarization of the photodetector of FIG. 2. The inset displays the best results in term of both responsivity and polarization independence.

The typical measured wall-plug responsivity versus bias voltage for both horizontal (solid line) and vertical (dashed line) light polarizations at 1.55 μm for the photodetector 1' is shown in FIG. 10. The inset displays the best results in term of both responsivity and polarization independence. Wall-plug responsivity are in the 8-12 mA/W range for detectors with W=30 μm, w=5 μm, L>500 μm and T=120 nm.

It is also to be noted that the polarization responsivity ratio is typically reduced from 5.5 (photodetector 1 of the first embodiment, see FIG. 9) down to 1.6 (photodetector 1' of the second embodiment, see FIG. 10). This is associated with the absence of a top-metal on most of the poly-Ge layer 4 with double contacts substantially U-shaped.

Figure 13A:
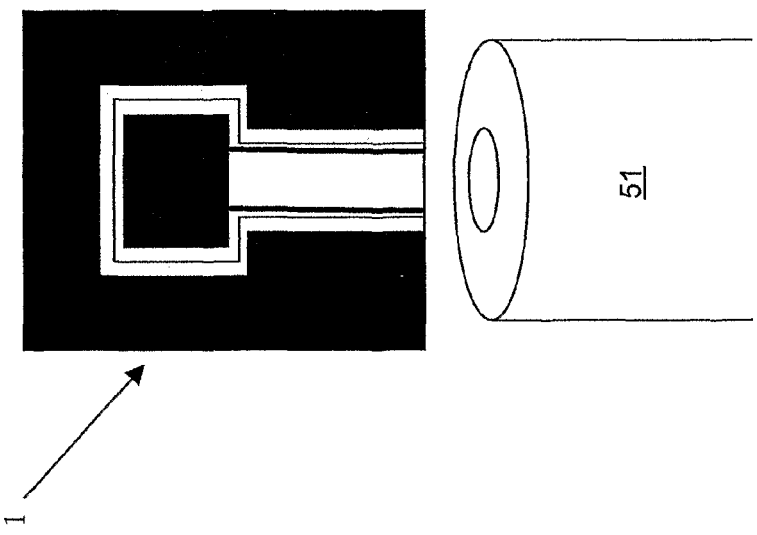
FIGS. 13a and 13b are two schematic configurations of the photodetector of the invention butt-coupled with an optical fiber, in the embodiment of FIG. 5b a piece of passive waveguide is also comprised.
Figure 13B:
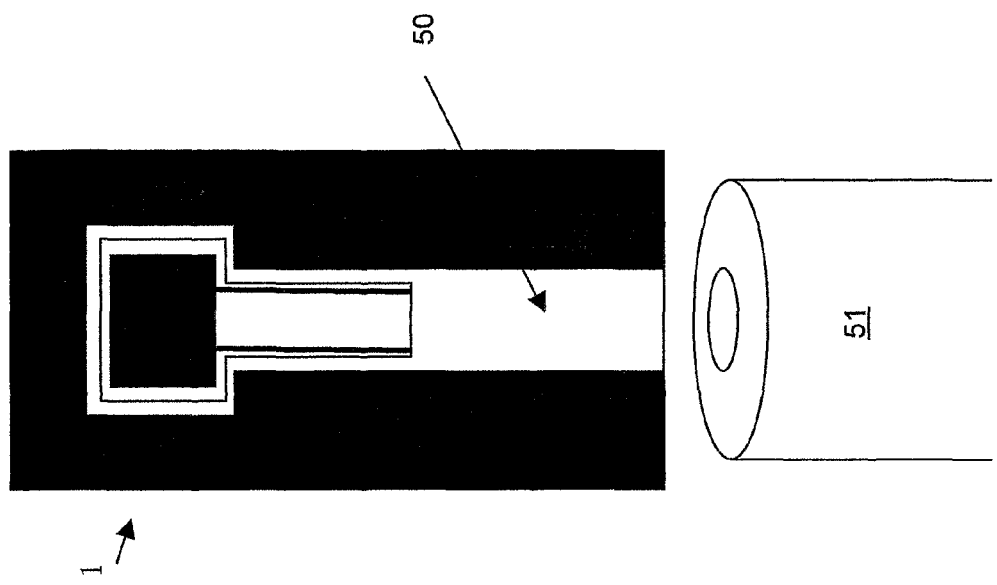
Figure 14:
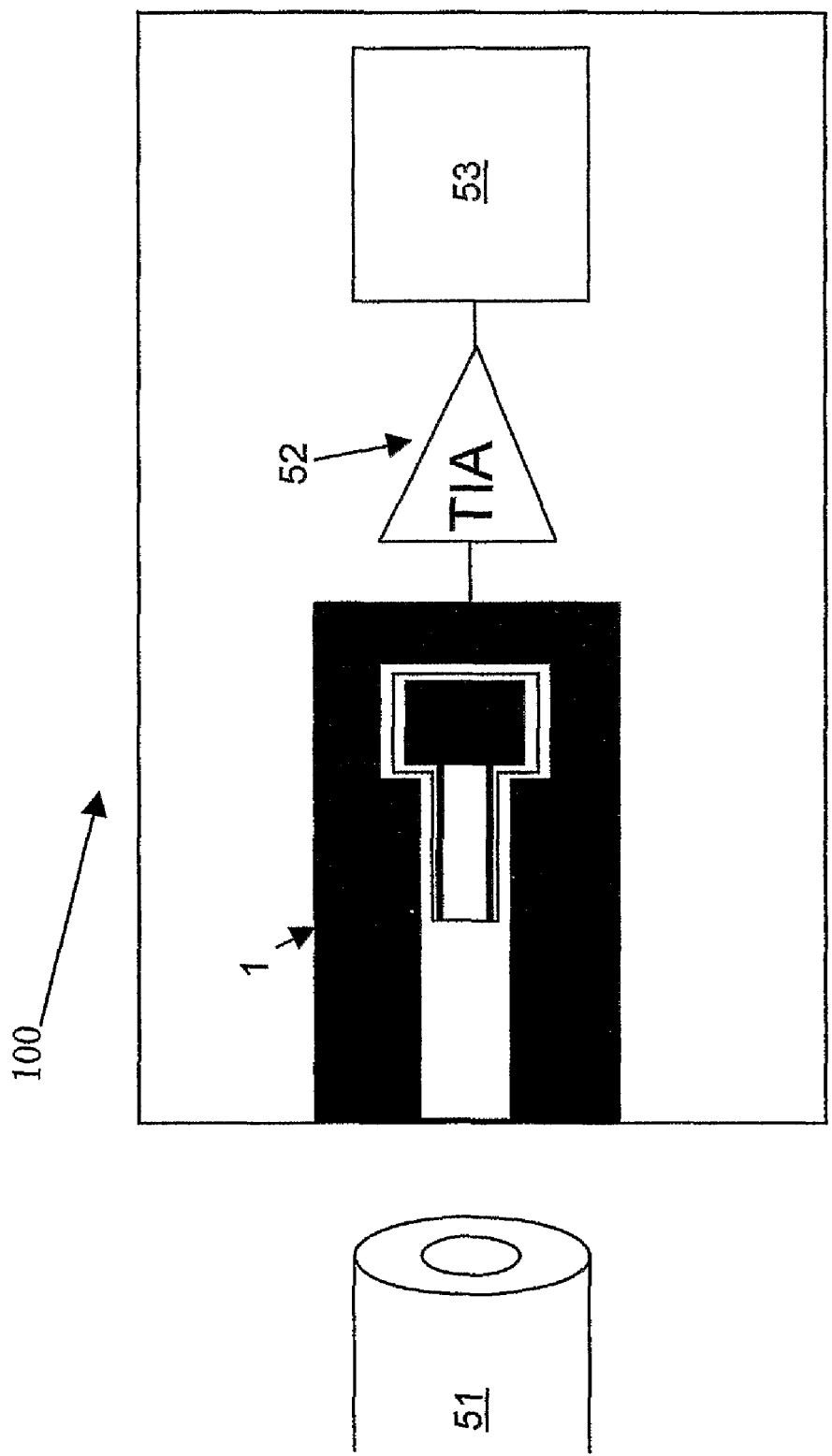
FIG. 14 shows a schematic diagram of a silicon integrated circuit comprising the photodetector, a transimpedance front-end and processing electronics.

Due to the high conductivity of the poly-Ge layer 4, the junction capacitance of the photodetector 1' of this second embodiment is substantially equal to the junction capacitance of the photodetector of the first embodiment, even if the contact area is different. Accordingly, the two devices exhibit an almost identical speed (see FIG. 11 for the speed of the photodetector 1 of the first embodiment). The photodetectors 1, 1', 1" of the invention may be used as discrete components of optical fiber communication receivers. The device 1, 1', 1" can be directly coupled with an optical fiber 51 (FIG. 13a) or coupled through a piece of waveguide 50 which allows routing and bending the incoming light (see FIG. 13b). They can be also used as part of various higher-level systems. The compatibility with standard VLSI silicon technology allows the fabrication of silicon based optoelectronic integrated circuits as the receiver 100 shown in FIG. 14. The receiver 100 comprises the photodetector 1 (or 1' or 1"), an analog front-end (transimpedance amplifier) 52 and some processing/addressing mixed-signal electronics 53.

Different systems can be employed using the photodetector of the invention to tap off a particular wavelength from an incoming optical signal for either monitoring purpose or for complete drop off. This light measurement can be both wideband and narrowband (wavelength selective).

FIGS. 15a-15e show different configurations which can utilize the photodetector of the invention. FIG. 15a shows a conventional configuration which can be designed for both wideband and narrowband tap off, FIG. 15b shows a wavelength selective ring resonator based sampling, FIG. 5c shows an in-line configuration which allows light monitoring which leaves the signal substantially the same, FIG. 15d shows a multiple tap off/detection for wavelength division multiplexing (WDM), and FIG. 15e shows an improved version of WDM receiver/monitor based on photonic crystals which greatly improve wavelength selectivity. In the mentioned figures, the photodetector is indicated with 1 for sake of conciseness, but either a photodetector according to the first embodiment 1 of the invention, or according to the second 1', 1" embodiment can be alternatively selected.

The invention claimed is:

1. A photodetector structure, comprising:
 a silicon-based waveguide in which optical signals to be detected travel in a given direction and are confined therein;
 a germanium layer disposed on a portion of said silicon-based waveguide so that an evanescent tail of the propagating optical signal in said waveguide is coupled into said germanium layer, said germanium layer comprising a mesa having a length along the signal propagating direction and a width in a direction substantially perpendicular to the propagating direction, and in which the width of said mesa is smaller than its length; and
 a first and a second metal contact, said first metal contact being located on said germanium layer, and said second metal contact being located on said silicon-based waveguide and in contact with said silicon-based waveguide, said first and second contacts being used to collect electrons generated by light absorption to obtain an output electric signal;
 wherein said first metal contact comprises a first and a second metallic strip disposed on said germanium layer.

2. The photodetector structure according to claim 1, wherein said germanium layer is a polycrystalline germanium layer.

3. The photodetector structure according to claim 2, wherein the length of said germanium mesa is between 10 μm≦L≦2000 μm.

4. The photodetector structure according to claim 3, wherein the length of said germanium mesa is between 400 µm≦L≦1000 µm.

5. The photodetector structure according to claim 2, wherein the width of said germanium mesa is between 10 µm≦W≦50 µm.

6. The photodetector structure according to claim 1, wherein said germanium layer is disposed directly in contact with a portion of said silicon-based waveguide.

7. The photodetector structure according to claim 1, wherein said second metal contact comprises a metallic strip located on top of said silicon-based waveguide.

8. The photodetector structure according to claim 1, wherein said second metal contact comprises two metal strips located on top of said silicon-based waveguide and disposed symmetrically with respect to said germanium layer.

9. The photodetector structure according to claim 1, comprising a layer and wherein said silicon-based waveguide is located on top of said layer which is realized on a substrate, said waveguide, said layer and said substrate forming a silicon-on-insulator structure.

10. The photodetector structure according to claim 9, wherein said layer is a $SiO_2$ layer.

11. The photodetector structure according to claim 9, wherein said substrate comprises silicon.

12. The photodetector structure according to claim 1, wherein said silicon-based waveguide is n-type.

13. The photodetector structure according to claim 1, wherein said germanium layer is p-type.

14. The photodetector structure according to claim 1, wherein the thickness of said silicon-based waveguide is 2 to 3 µm.

15. The photodetector structure according to claim 1, wherein said first and second metallic strips are positioned one parallel to the other.

16. The photodetector structure according to claim 1, wherein said first and second metallic strips both have substantially the same length as said germanium mesa.

17. The photodetector structure according to claim 1, wherein said first and second strips have a width between 2 µm≦w≦10 µm.

18. The photodetector structure according to claim 17, wherein said first and second strips have equal width.

19. The photodetector structure according to claim 1, wherein the width of said germanium mesa is between 20 µm≦W'≦50 µm.

20. The photodetector structure according to claim 1, wherein said germanium mesa comprises a top surface and said first and second strips are disposed symmetrically on said top surface.

21. The photodetector structure according to claim 1, wherein said germanium mesa comprises a top surface and said first and second strips are located a given distance away from a lateral edge of said top surface.

22. The photodetector structure according to claim 21, wherein said given distance is on the order of 1 µm.

23. The photodetector structure according to claim 1, wherein the thickness of said germanium mesa is between 60 nm≦T'≦200 nm.

24. The photodetector structure according to claim 23, wherein the thickness of said germanium mesa is between 80 nm≦T'≦180 nm.

25. The photodetector structure according to claim 1, wherein the distance between said first and said second metal contacts is between 10 µm≦d≦20 µm.

26. The photodetector structure according to claim 1, wherein said germanium layer comprises a pad from which said mesa extends.

27. The photodetector structure according to claim 26, wherein a metal pad is located above said pad realized in said germanium layer.

28. The photodetector structure according to claim 27, wherein said metal pad is square.

29. The photodetector structure according to claim 1, wherein said first and said second metal contacts comprise gold.

30. The photodetector structure according to claim 1, wherein said first and said second metal contacts comprise silver.

31. An optical fiber communication receiver comprising the photodetector structure according to claim 1.

32. An optical filter comprising the photodetector structure according to claim 1.

33. The photodetector structure according to claim 1, wherein the thickness of said germanium mesa is between about 100 nm≦T≦ about 160 nm.

* * * * *